Jan. 21, 1964 F. L. HATKE ETAL 3,119,056
REGULATED TRANSISTOR OSCILLATOR
Filed July 21, 1960
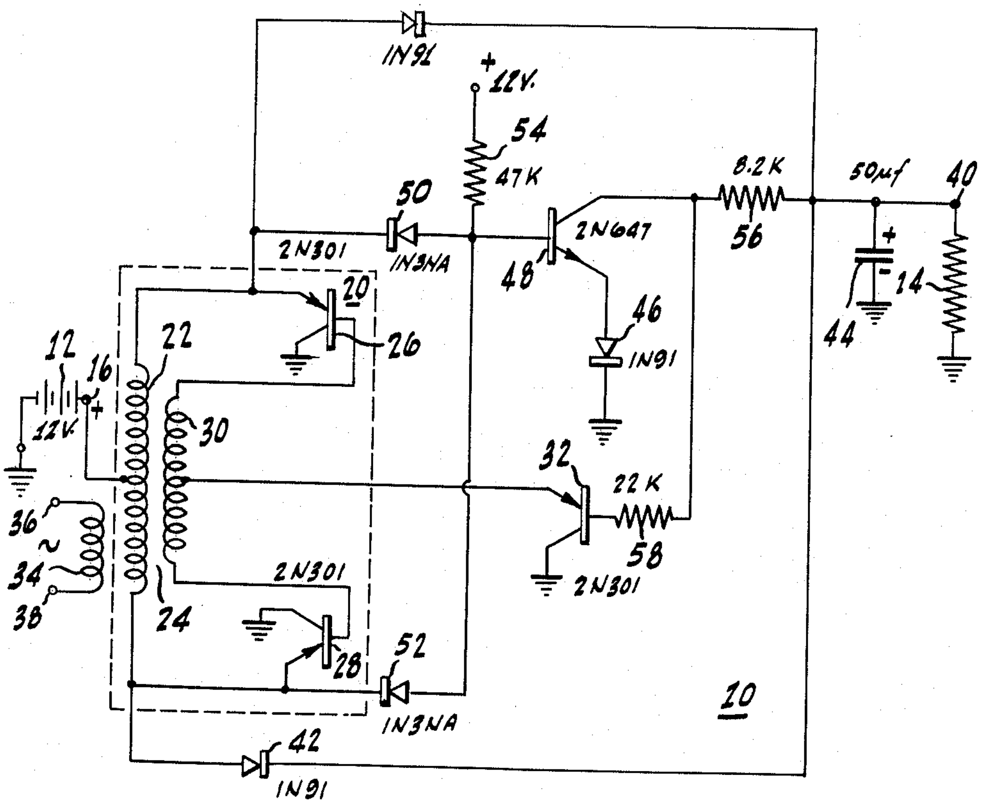
INVENTORS
GEORGE W. GRAY &
FRED L. HATKE
BY Morris L. Rabkin
ATTORNEY United States Patent Office
3,119,056
Patented Jan. 21, 1964

3,119,056

REGULATED TRANSISTOR OSCILLATOR

Fred Louis Hatke, Union City, and George William Gray, Lambertville, N.J., assignors to Radio Corporation of America, a corporation of Delaware Filed July 21, 1960, Ser. No. 44,394
12 Claims. (Cl. 321—2)

This invention relates generally to transistor oscillators, and more particularly to an improved transistor oscillator of the type adapted to supply energy efficiently to a variable load. The improved transistor oscillator of the present invention is particularly useful in power supplies of the inverter or converter types wherein a source of relatively low, unidirectional voltage is inverted and/or converted to a relatively higher voltage.

The transistor oscillator of the present invention will be described in connection with a transistor power converter, but it will be understood that this invention obtains in other applications where a transistor oscillator is adapted to supply energy to a variable load.

Many conventional, transistor power converters employing transistor oscillators possess a basic disadvantage, namely, the drive current to the bases of the transistors in the oscillator circuits is substantially constant regardless of the load on the oscillator circuit. If, for example, the base drive current of the transistor is an optimum amount for a light power load, the oscillator may not continue to oscillate when a heavy load is placed on it. Conversely, if the base drive current of the transistors is an optimum amount for heavy loads, the transistor oscillator will operate at a relatively low efficiency for light loads. Under the latter conditions, energy would be wasted, and the transistors would tend to overheat. Where a transistor oscillator is used in a power converter (for example, to supply energy to a variable load, such as to a mobile radio receiver and transmitter) it is important and desirable to operate the transistor oscillator under conditions of maximum efficiency for all loads.

Accordingly, it is an object of the present invention to provide an improved transistor oscillator that will supply energy to a variable load with a maximum of efficiency.

Another object of the present invention is to provide an improved transistor oscillator wherein at least one transistor conducts alternately with the same degree of saturation regardless of variations in energy taken from the oscillator.

Still another object of the present invention is to provide an improved transistor oscillator of increased efficiency for use in converter and inverter power supplies for variable loads.

A further object of the present invention is to provide an improved transistor oscillator that is relatively simple in structure, very reliable in operation, and highly efficient in use over a wide range of conditions where different amounts of energy are taken from the oscillator.

In accordance with the present invention, the improved transistor oscillator comprises a circuit wherein at least one transistor conducts periodically. Means are provided to operate the transistor, and, consequently, the oscillator, with maximum efficiency, that is, at the same degree of current saturation under substantially all conditions wherein varying amounts of energy are taken from the oscillator. Since the emitter-collector voltage of the transistor tends to vary with variations in the load on the oscillator, the emitter-collector voltage is compared with a source of reference potential of an amplitude that is substantially an optimum value for the most efficient operation of the transistor oscillator. An error signal is obtained by this comparison, and the error signal is applied to a variable impedance in the base circuit of the transistor to control the base drive current of the transistor. Thus, the base drive current of the transistor is varied in a manner to maintain the emitter-collector voltage of the transistor substantially constant. Under these conditions, the transistor oscillator functions most efficiently for all loads on it.

The novel features of the present invention, both as to its organization and method of operation, as well as additional objects and advantages thereof, will be more readily understood from the following description, when read in connection with the accompanying drawing in which the single figure is a schematic diagram of a power converter employing the improved transistor oscillator circuit of the present invention.

Referring, now, to the drawing, there is shown a power converter 10 for converting a unidirectional voltage from a source 12 of relatively low voltage to a relatively much higher voltage for a load 14, illustrated as a resistor. The positive terminal of the voltage source 12 is connected to an input terminal 16 of the converter 10, and the negative terminal of the voltage source 12 is connected to a common connection, designated herein as ground.

A transistor oscillator 20 of the push-pull type is provided to convert the unidirectional voltage from the source 12 to an alternating voltage. To this end, the input terminal 16 is connected to the center tap of the primary winding 22 of a transformer 24. The opposite ends of the primary winding 22 are connected to the emitters of PNP transistors 26 and 28, respectively. The opposite ends of the secondary winding 30 of the transformer 24 are connected, respectively, to the bases of the transistors 26 and 28. The center tap of the secondary winding 30 is connected to ground through a variable impedance, such as a PNP transistor 32, for the purposes hereinafter appearing. The collectors of the transistors 26 and 28 are connected to ground.

The oscillator 20, thus far described, except for the transistor 32, is a known push-pull oscillator wherein the transistors 26 and 28 conductor alternately. Briefly, the operation of the oscillator 20, considering the transistor 32 as a fixed impedance, is as follows: Let it be assumed that the transistor 26 begins to conduct, and the transistor 28 is cut off. Current from the voltage source 12 flows through the primary winding 22 and the emitter-collector path of the transistor 26 and causes transformed voltages to be applied as a forward bias to the base of the transistor 26 and as a reverse bias to the base of the transistor 28. Current increases through the transistor 26 until it becomes saturated. The magnetic field that has been built up about the transformer 24, as a result of conduction by the transistor 26, now begins to decrease. This decreasing field causes the polarities of the voltages at the bases of the transistors 26 and 28 to reverse so that the transistor 26 will be cut off and the transistor 28 will be caused to conduct. The transistor 28 will conduct and the magnetic field about the transformer will increase until the transistor 28 becomes saturated. The magnetic field will now decrease and the polarities of the voltages at the bases of the transistors 26 and 28 will be reversed again so that the cycle of operation will be repeated.

Means are provided to derive energy from the transistor oscillator 20. To this end, a tertiary winding 34 is magnetically coupled to the other windings of the transformer 24. An alternating voltage may now be derived between output terminals 36 and 38 at the two ends, respectively, of the tertiary winding 34. If it is desired to convert the alternating-current (A.-C.) voltage across the winding 22 of the transformer 24 to a direct-current (D.-C.) voltage, one end of the winding 22 is connected to an output terminal 40 through a rectifier, such as a diode 42. The other end of the winding 22 may also be connected to the output terminal 40 through a diode, as shown, if desired. The load 14 is connected between the output terminal 40 and ground, and the D.-C. voltage applied across it is filtered by a capacitor 44 connected across the load. It will now be apparent that electrical energy may be derived from the oscillator 20 either in the form of an A.C. or a D.C. output or both.

If, for the circuitry thus far described, the transistor 32 were considered a fixed impedance, the base drive current to the transistors 26 and 28 of the oscillator 20 would be substantially constant for all loads, and the efficiency of operation of the oscillator 20 would vary with different loads. The efficient operation of these transistors, and, consequently, the oscillator, requires their base drive current to vary when different loads are placed on the oscillator 20 so that the transistors can be driven always to a predetermined degree of saturation. It has been found that the oscillator 20 operates with maximum efficiency when the transistors 26 and 28 are biased so that their base current just drives the transistors into saturation. Under this ideal condition, the emitter-collector voltage of each of the similar transistors 26 and 28 is of a predetermined amplitude substantially equal to the voltage across a forward-biased, junction diode 46 connected to the emitter of a transistor 48, shortly to be described in more detail. The diode 46 has a temperature coefficient substantially equal to that of the transistors 26 and 28 and provides a reference potential to be referred to more particularly hereinafter.

Means are provided to compare the emitter-collector voltage of the transistors 26 and 28 with the voltage across the forward-biased, junction diode 46. To this end, the emitters of the transistors 26 and 28 are connected to the base of an NPN transistor 48 through separate diodes 50 and 52, respectively. The anodes of the diodes 50 and 52 are connected directly to the base of the transistor 48, and to a source of positive voltage, which may be the voltage source 12, through a resistor 54. The diodes 52 and 50 function as switches that are considered open when the voltage at their cathodes is equal to the voltage at their anodes, as when the transistors 26 and 28 are not conducting. The diodes 52 and 50 are considered closed switches when the transistors 26 and 28 are conducting because the emitter voltage (and the voltage as the cathodes of the diodes 50 and 52) is now only a fraction of a volt above ground. The emitter of the transistor 48 is connected to ground through the diode 46 with the latter being poled so that conventional current will flow in the forward direction through the diode 46 from the transistor 48 emitter to ground. The collector of the transistor 48 is connected to the cathode of the diode 42 through a load resistor 56. The collector of the transistor 48 is also connected to the base of the transistor 32 through a current-limiting resistor 58 for varying the impedance of the transistor 32 with an error signal. The impedance of the transistor 32 controls, in turn, the base drive current of the transistors 26 and 28.

The efficient operation of the transistor oscillator 20 under conditions of varying loads, in accordance with the present invention, will now be explained. Let it be assumed that a large amount of energy is taken suddenly from the oscillator 20 either by a heavy load (not shown) applied suddenly across the terminals 36 and 38 or by a sudden decrease in the resistance of the load resistor 14. Under these conditions, the emitter-collector voltage of each of the transistors 26 and 28 will tend to increase. When the transistor 26 is conducting, its emitter-collector voltage is sampled and compared with the reference potential across the forward-biased diode 46. It is noted that the diode 50 acts as a switch to couple the emitter of the transistor 26 to the base of the transistor 48 only when the transistor 26 is conducting. Thus, the emitter-collector voltage of the conducting transistor 26 is compared to the voltage across the conducting diode 46 by means of the transistor 48. As a result of this comparison, an error signal is obtained at the collector of the transistor 48 that is applied to the base of the transistor 32. Thus, a positive-going voltage at the emitter of the transistor 26 results in a negative-going error signal at the base of the transistor 32. This action causes a decrease in the impedance of the transistor 32, and more base drive current flows in the base circuit of the transistor 26 to cause its emitter-collector voltage to remain substantially constant. This increase in its base drive current causes the transistor 26 to conduct with the proper degree of saturation for maximum efficiency of the oscillator. The emitter-collector voltage of the transistor 28 is also sampled in a manner similar to the transistor 26 to obtain an error signal. It is noted that the emitter-collector voltages of the transistors 26 and 28 are sampled respectively and compared with the voltage across the forward-biased diode 46 only when the diodes 50 and 52 are respectively conducting, and the latter diodes will conduct respectively only when the transistors 26 and 28 are conducting.

Let it now be assumed that a relatively small amount of energy is taken from the transistor oscillator 20, and the base drive current to the transistors 26 and 28 tends to cause them to oversaturate and to overheat when they are conducting. Under these conditions, a negative-going, emitter-collector voltage of the transistors 26 and 28 causes a positive-going error signal at the base of the transistor 32. This latter action tends to increase the impedance of the transistor 32 and to reduce the base drive current to the transistors 26 and 28 so that the oscillator 20 may operate more efficiently. Thus, it will be apparent that any tendency of the transistors 26 and 28 of the oscillator 20 to depart from efficient operation is offset by the production of an error signal that varies automatically the base drive current of the transistors in a compensating manner. Also, the compensating action tends to prevent overheating of the transistors 26 and 28. The efficiency of operation of the oscillator 20 is a maximum when the transistors 26 and 28 are operating with a maximum of efficiency.

From the foregoing description, it will be apparent that there has been provided an improved transistor oscillator that is adapted to operate with a maximum of efficiency regardless of the amount of energy taken from it. The values of the components indicated on the drawing are merely illustrative of one embodiment of the oscillator circuit, in accordance with the present invention, in a converter circuit adapted to supply loads varying from 0 to 4 amperes at 24 volts. While only one embodiment of this invention has been described and illustrated, variations of the transistor oscillator coming within the spirit of this invention will, no doubt, readily suggest themselves to those skilled in the art. For example, the transistor oscillator may be a blocking oscillator employing a periodically conducting transistor. By reversing the polarities of the voltages and the diodes, each PNP transistor can be replaced by an NPN transistor, and the NPN transistor can be replaced by a PNP transistor. Hence, it is desired that the foregoing description of the invention be considered as illustrative and not in a limiting sense.

What is claimed is:

1. In combination, an oscillator circuit comprising a transistor having an emitter, a base and a collector, a first circuit connected between said emitter and said collector, a second circuit connected between said emitter and said base, said first and said second circuits being coupled to each other to cause said oscillator circuit to oscillate and said transistor to conduct current periodically, means connected to said first circuit to sample the voltage between said emitter and said collector when said transistor is conducting, means providing a reference potential, means connected to said sampling means and to said reference potential to compare said voltage with said reference potential to obtain an error signal, and means connected to said second circuit to apply said error signal to said second circuit to vary its impedance so as to maintain said voltage substantially constant whereby to operate said transistor at a desired degree of saturation.

2. In combination, an oscillator circuit comprising a transistor having an emitter, a base and a collector, a first circuit connected between said emitter and said collector, a second circuit connected between said emitter and said base, said first and said second circuits being coupled to each other to cause said oscillator circuit to oscillate and said transistor to conduct current periodically, a first diode, means including said first diode connected to said first circuit to sample the voltage between said emitter and said collector when said transistor is conducting, a second diode, means including said second diode to provide a reference potential, means connected to said sampling means and to said reference potential to compare said voltage with said reference potential to obtain an error signal, and means to apply said error signal to said second circuit to vary its impedance so as to maintain said voltage substantially constant.

3. In combination, an oscillator circuit adapted to supply energy to a load that tends to vary, said oscillator circuit comprising a first transistor having an emitter, a base and a collector, a first circuit connected between said emitter and said collector, a second circuit connected between said emitter and said base, said first and said second circuits being coupled to each other to cause said oscillator circuit to oscillate and said transistor to conduct current periodically, means connected to said first circuit to sample the voltage between said emitter and said collector when said first transistor is conducting, said second circuit comprising a second transistor having a base, an emitter and a collector, means connecting the emitter-collector path of said second transistor between said base and said collector of said first transistor, means providing a reference potential, means connected to said sampling means and to said reference potential to compare said voltage with said reference potential to obtain an error signal, and means to apply said error signal to said base of said second transistor whereby to control the impedance of said emitter-collector path so as to maintain said voltage between said emitter and said collector of said first transistor substantially constant.

4. In combination, an oscillator circuit adapted to supply energy to a load that tends to vary, said oscillator circuit comprising a first transistor having an emitter, a base and a collector, a first circuit connected between said emitter and said collector, a second circuit connected between said emitter and said base, said first and said second circuits being coupled to each other to cause said oscillator circuit to oscillate and said transistor to conduct current periodically, a first diode, means including said first diode connected to said first circuit to sample the voltage between said emitter and said collector when said first transistor is conducting, said second circuit comprising a second transistor having a base, an emitter and a collector, means connecting the emitter-collector path of said second transistor between said base and said collector of said first transistor, a second diode, means connecting said second diode to provide a reference potential across said second diode, means connected to said sampling means and to said reference potential to compare said voltage with said reference potential to obtain an error signal, and means to apply said error signal to said base of said second transistor in a polarity to maintain said voltage substantially constant.

5. An oscillator circuit adapted to supply energy to a load that tends to vary, said oscillator circuit comprising a first transistor having an emitter, a base and a collector, a first circuit connected between said emitter and said collector, a second circuit connected between said emitter and said base, said first and said second circuits being coupled to each other to cause said oscillator circuit to oscillate and said transistor to conduct current periodically, means connected to said first circuit to sample the emitter-collector voltage of said first transistor during conduction thereof, means to provide a reference potential substantially equal to said emitter-collector voltage when said first transistor is conducting efficiently in said oscillator circuit, means connected to said sampling means and to said reference potential to compare said emitter-collector voltage with said reference potential to obtain an error signal, said second circuit comprising a second transistor having an emitter, a base and a collector, means connecting the emitter-collector path of said second transistor between said base and said collector of said first transistor, and means connected to said base of said second transistor to apply said error signal to said base of said second transistor to vary the impedance of the latter and to control the base current of said first transistor in a manner to maintain said emitter-collector voltage of said first transistor substantially constant whereby to operate said first transistor at the same degree of saturation regardless of variations in said load.

6. In a power supply of the type wherein a transistor oscillator circuit is energized by a source of relatively low unidirectional voltage and wherein energy is derived from said oscillator circuit to supply a load on the power supply, said transistor being connected in said oscillator circuit to conduct current intermittently, the combination therewith of means connected to the emitter-collector path of said transistor to sample the emitter-collector voltage of said transistor when said transistor is conducting, means providing a reference potential substantially equal to said emitter-collector voltage when said transistor is conducting at a desired degree of saturation, means connected to said sampling means and to said reference potential to compare said voltage with said reference potential to obtain an error signal, and means connected to the base of said transistor to apply said error signal to said base of said transistor in a polarity to maintain said emitter-collector voltage substantially constant whereby to operate said transistor at said desired degree of saturation.

7. In an arrangement of the type wherein a transistor oscillator circuit is energized by a source of relatively low unidirectional voltage, and wherein energy is derived from said oscillator circuit to supply a load that tends to vary, said oscillator circuit comprising a pair of transistors each having an emitter, a collector and a base, a transformer having a first winding and a second winding, said first winding being connected between said emitters of said transistors, said second winding being connected between said bases of said transistors, and means to connect source of voltage between a tap on said first winding and said collectors of said transistors, whereby said transistors are connected in said oscillator circuit in a push-pull arrangement to conduct current intermittently and alternately with respect to each other, the combination therewith of means connected across the emitter-collector path of each of said transistors to sample the emitter-collector voltage of each of said transistors only while each of said transistors is conducting, means providing a reference potential, means connected to said sampling means and to said reference potential to compare said emitter-collector voltage of each of said transistors with said reference potential to obtain an error signal, means providing a variable impedance, means including said second winding connecting said variable impedance between said base and said collector of each of said transistors, and means connected between said comparing means and said variable impedance means for applying said error signal so said variable impedance means to control the impedance thereof whereby to control the conduction of said transistors in accordance with the variations in said load.

8. An oscillator circuit for supplying energy to a load that tends to vary, said oscillator circuit comprising a transformer having primary and secondary windings and a pair of transistors each having an emitter, a collector and a base, means connecting the ends of said primary winding respectively to said emitters of said transistors, means connecting the ends of said secondary winding respectively to said bases of said transistors, means connecting said collectors to a common connection, means to apply a source of voltage between a point that is between the ends of said primary winding and said common connection, a third transistor having an emitter, a collector and a base, means to connect the emitter-collector path of said third transistor between a point between the ends of said secondary winding and said common connection, a fourth transistor having an emitter, a collector and a base, means for effectively connecting respectively said emitters of said pair of transistors to said base of said fourth transistor only when either transistor of said pair of transistors is conducting, means providing a reference potential, means connecting said reference potential between said emitter of said fourth transistor and said common connection, means connecting said collector of said fourth transistor to said base of said third transistor, means connecting said collector of said fourth transistor to said load, a rectifier, and means connecting said rectifier between one of said ends of said primary winding and said load.

9. Means for converting a relatively low unidirectional voltage to a relatively higher voltage for a load, said converting means comprising an oscillator, said oscillator comprising a transistor having an emitter, a collector and a base, a first circuit connected between said emitter and said collector, a second circuit connected between said emitter and said base, said first and said second circuits being coupled to each other to cause said oscillator to oscillate when energized, means connected to said first circuit to energize said oscillator by said unidirectional voltage to cause said transistor to conduct current intermittently, a variable impedance, means in said second circuit connecting said variable impedance to said base of said transistor, means to provide a reference potential, means connected to said reference potential and said first circuit to compare the emitter-collector voltage of said transistor with said reference potential to obtain an error signal when said transistor is conducting, and means connecting said comparing means to said variable impedance to apply said error signal to said variable impedance to control the impedance thereof whereby to control said current.

10. Converter means as set forth in claim 9 wherein said reference potential is of an amplitude substantially equal to the emitter-collector voltage of said transistor when said transistor is conducting efficiently.

11. In a circuit arrangement wherein an oscillator circuit is energized by a relatively low unidirectional voltage and wherein energy is derived from said oscillator circuit for a load that tends to vary, in combination, a pair of transistors each having an emitter, a collector and a base, a transformer having a pair of inductively coupled windings, one of said windings being connected between said emitters of said transistors, the other of said windings being connected between said bases of said transitsors, means to connect a source of voltage between a tap on said one winding and said collectors of said transistors whereby said transistors are connected in said oscilaltor circuit in a push-pull arrangement to conduct current intermittently and alternately with respect to each other, separate means connected across the emitter-collector path of each of said transistors for sampling the emitter-collector voltage of each of said transistors only while each of said transistors is conducting, a third transistor having an emitter-collector path and a base, means including said other winding connecting said emitter-collector path of said third transistor between said base and said collector of each transistor of said pair of transistors, means providing a reference potential substantially equal in amplitude to the emitter-collector voltage of each transistor of said pair of transistors during efficient conduction thereof, means connected to each of said sampling means and to said reference potential to compare said emitter-collector voltage of each of said transistors of said pair of transistors with said reference potential to obtain an error signal, and means connected between said comparing means and said variable impedance means for applying said error signal to said base of said third transistor to vary the impedance thereof whereby to control the conduction of said pair of transistors for efficient operation of said oscillator circuit.

12. A circuit arrangement as set forth in claim 11 wherein said reference potential comprises the voltage across a forward-biased diode.

References Cited in the file of this patent

UNITED STATES PATENTS

| | | |
|---|---|---|
| 2,791,739 | Light | May 7, 1957 |
| 2,959,745 | Grieg | Nov. 8, 1960 |
| 2,968,738 | Pintell | Jan. 17, 1961 |

FOREIGN PATENTS

| | | |
|---|---|---|
| 815,668 | Great Britain | July 1, 1959 |

UNITED STATES PATENT OFFICE

CERTIFICATE OF CORRECTION

Patent No. 3,119,056 January 21, 1964

Fred Louis Hatke et al.

It is hereby certified that error appears in the above numbered patent requiring correction and that the said Letters Patent should read as corrected below.

Column 2, line 39, for "conductor" read -- conduct --; column 6, line 48, before "source" insert -- said --; line 66, for "so" read -- to --; column 8, line 9, for "transitsors" read -- transistors --; line 12, for "oscilaltor" read -- oscillator --.

Signed and sealed this 22nd day of September 1964.

SEAL)

ttest:

RNEST W. SWIDER
testing Officer

EDWARD J. BRENNER
Commissioner of Patents